(12) United States Patent
Liu et al.

(10) Patent No.: US 12,160,216 B2
(45) Date of Patent: Dec. 3, 2024

(54) HEATPIPE TO HELP REDUCE RADIO FREQUENCY INTERFERENCE

(71) Applicant: Intel Corporation, Santa Clara, CA (US)

(72) Inventors: Kae-An Liu, Taipei (TW); Jaejin Lee, Beaverton, OR (US); David W. Browning, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 839 days.

(21) Appl. No.: 17/122,075

(22) Filed: Dec. 15, 2020

(65) Prior Publication Data

US 2021/0104995 A1   Apr. 8, 2021

(51) Int. Cl.
| | | |
|---|---|---|
| *H03H 7/01* | (2006.01) | |
| *H01P 1/20* | (2006.01) | |
| *H01Q 1/02* | (2006.01) | |
| *H05K 7/20* | (2006.01) | |

(52) U.S. Cl.
CPC ......... *H03H 7/0115* (2013.01); *H01P 1/2005* (2013.01); *H01Q 1/02* (2013.01); *H05K 7/20336* (2013.01)

(58) Field of Classification Search
CPC ............................ H01P 1/2005; H03H 7/0115
USPC .................................................. 333/202–205
See application file for complete search history.

(56) References Cited

U.S. PATENT DOCUMENTS

| | | | | |
|---|---|---|---|---|
| 2011/0134010 | A1* | 6/2011 | Toyao | H01P 5/028 |
| | | | | 343/848 |
| 2013/0249652 | A1* | 9/2013 | Pajovic | H01P 1/20345 |
| | | | | 333/204 |
| 2018/0031329 | A1 | 2/2018 | Wang et al. | |
| 2019/0387642 | A1 | 12/2019 | Toleno et al. | |
| 2020/0058994 | A1 | 2/2020 | Chen | |

FOREIGN PATENT DOCUMENTS

| | | |
|---|---|---|
| EP | 2759794 A1 | 7/2014 |
| EP | 4017233 A1 | 6/2022 |

OTHER PUBLICATIONS

European Extended Search Report issued in EP Application No. 21 19 8671.6 on Mar. 16, 2022; 7 pages.

* cited by examiner

*Primary Examiner* — Rakesh B Patel

(74) *Attorney, Agent, or Firm* — Banner & Witcoff Ltd.

(57) ABSTRACT

Particular embodiments described herein provide for an electronic device that can be configured to include a substrate, a heat source on the substrate, and a heat pipe. The heat pipe includes a plurality of bumps that extend from the heat pipe towards the substrate but do not come into contact with the substrate. The bumps are configured to help mitigate radio frequency interference in the electronic device. More specifically, the bumps can be configured to provide a resonant frequency in a specific radio frequency band and act as a radio frequency filter.

18 Claims, 12 Drawing Sheets

| WIDTH | LENGTH | SPACING | HEIGHT | GAP |
|---|---|---|---|---|
| 4 (0.075$\lambda_c$) | 8 (0.15$\lambda_c$) | 4.5 (0.84$\lambda_c$) | 1.5 (0.28$\lambda_c$) | 0.5 (0.9$\lambda_c$) |

HEATPIPE TO HELP REDUCE RADIO FREQUENCY INTERFERENCE

TECHNICAL FIELD

This disclosure relates in general to the field of computing, and more particularly, to a heat pipe to help reduce radio frequency interference.

BACKGROUND

Emerging trends in systems place increasing performance demands on the system. The increasing performance demands can cause radiating noise level and thermal increases in the system. The radiating noise level and thermal increases can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which.

Figure 1:
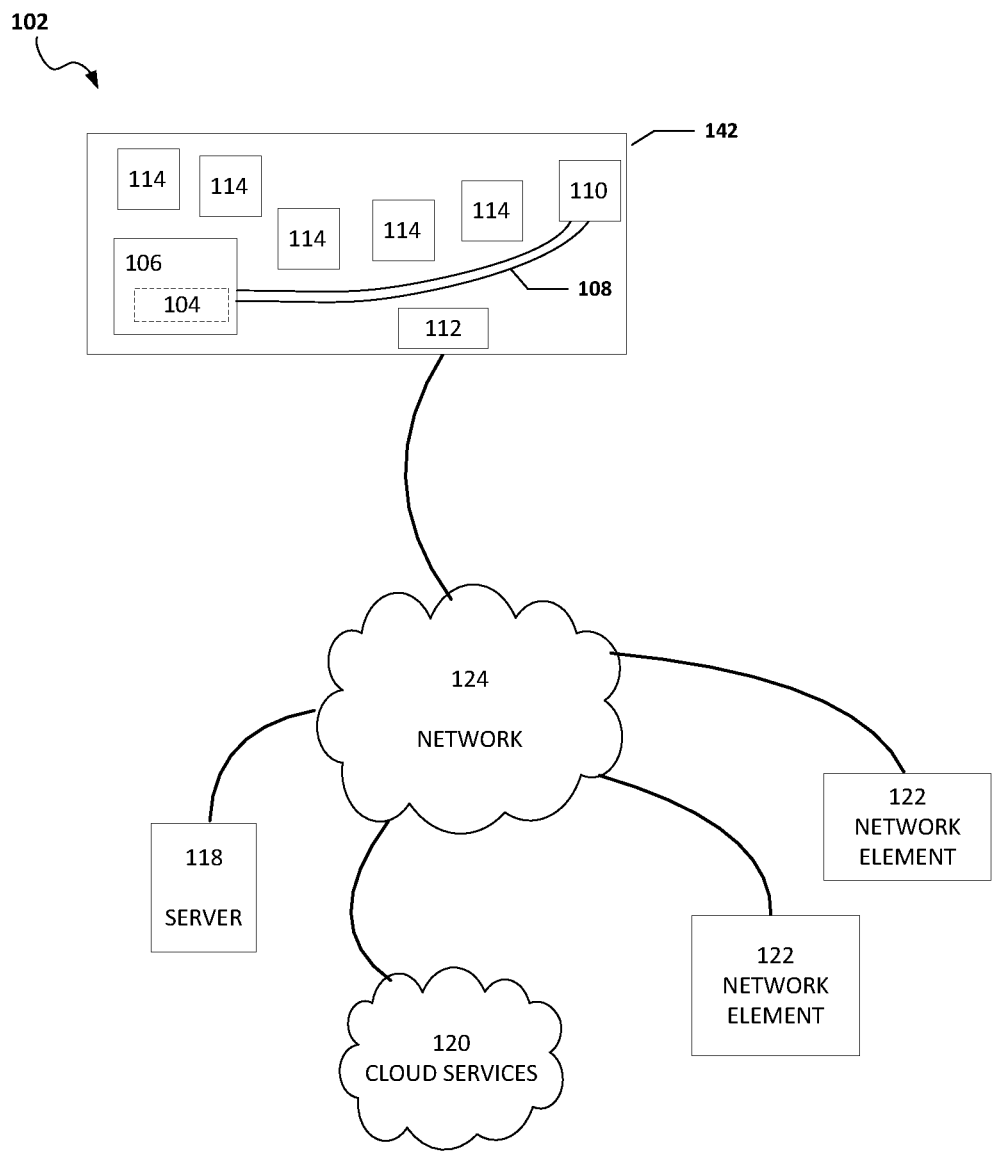
FIG. 1 is a simplified block diagram of a system to enable a heat pipe to help reduce radio frequency interference, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a heat pipe to help reduce radio frequency interference. Features such as structure(s), function(s), and/or characteristic(s), for example, are described with reference to one embodiment as a matter of convenience; various embodiments may be implemented with any suitable one or more of the described features.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers. The term "about"

indicates a tolerance of ten percent (10%). For example, about one (1) mm would include one (1) mm and ±0.1 mm from one (1) mm.

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example.

FIG. 1 is a simplified block diagram of a system to enable a heat pipe to help reduce radio frequency interference, in accordance with an embodiment of the present disclosure. As illustrated in FIG. 1, electronic device 102 includes one or more heat sources 104, a thermal conductor 106, a radio frequency interference (RFI) mitigating heat pipe 108, a heatsink 110, a radiation sensitive component 112, one or more electronic components 114, and a chassis 142. Chassis 142 can be the housing and/or the outer shell of electronic device 102.

Each of one or more heat sources 104 may be a heat generating device (e.g., processor, logic unit, field programmable gate array (FPGA), chip set, a graphics processor, graphics card, battery, memory, or some other type of heat generating device). Thermal conductor 106 can be a cold plate comprising copper, aluminum, and/or some other material that can conduct thermal energy away from heat source 104 and to RFI mitigating heat pipe 108. RFI mitigating heat pipe 108 can be any heat pipe that can transfer or carry away the thermal energy from heat source 104 and is configured to act as a radiation filter. More specifically, RFI mitigating heat pipe 108 can be configured as a physical radio frequency filter to help mitigate and reduce RFI that travels along RFI mitigating heat pipe 108. In an example, RFI mitigating heat pipe 108 can include a vapor chamber. Heatsink 110 can be a passive or active heat dissipater. Radiation sensitive component 112 can be an antenna that is susceptible to radio frequency interference (RFI). Components 114 can be a device or group of devices available to assist in the operation or function of electronic device 102. Electronic device 102 may be in communication with server 118, cloud services 120, and/or network elements 122 using network 124. In some examples, electronic device 102 may be standalone devices and not connected to network 124 or another device.

In electronic device 102, various components can produce RFI and/or be susceptible to RFI. For example, the radiation from heat source 104 can interfere with radiation sensitive component 112. In some current systems, the heat pipe of current systems can act as an antenna and amplify the RFI noise (e.g., noise from the printed circuit board (PCB) of some current systems) and allow the RFI to travel along the heat pipe. Often, the antenna of some current systems must be located near a heat pipe due to design constraints and this can cause problems, especially when the heat pipe acts as an antenna for the RFI noise. Some systems ground the heat pipe so that it becomes a poor antenna. However, the grounding of the heat pipe sacrifices PCB area and the area where the heat pipe is grounded cannot be used for signal routing or other components. In some systems, a conducive gasket is used to ground the heat pipe. However, this consumes space and can take up areas that need to be used for signal routing. Also, it can sometimes be difficult to achieve a good connection and grounding with the conducive gasket.

RFI mitigating heat pipe 108 can be configured to include electromagnetic waves filters operating in radio frequency (RF) bands by including electrically conductive bumps. More specifically, the bumps can have a particular dimension to provide a resonant frequency in one or more RF bands and act as a RF filter for radiation and help to mitigate the effects of the radiation on a radiation sensitive component 112 and help mitigate and reduce RFI that travels along RFI mitigating heat pipe 108. The radiation may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of electronic device 102. For example, electromagnetic interference (EMI) and RFI affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). RFI mitigating heat pipe 108 can be configured to filter out at least a portion of and/or mitigate the effects of the EMI and RFI. The term "RFI" includes RFI, EMI, and other similar radiation that can be filtered and/or mitigated using the bumps on RFI mitigating heat pipe 108.

It is to be understood that other embodiments may be utilized and structural changes may be made without departing from the scope of the present disclosure. Substantial flexibility is provided in that any suitable arrangements and configuration may be provided without departing from the teachings of the present disclosure.

Elements of FIG. 1 may be coupled to one another through one or more interfaces employing any suitable connections (wired or wireless), which provide viable pathways for network (e.g., network 124, etc.) communications. Additionally, any one or more of the elements of FIG. 1 may be combined or removed from the architecture based on particular configuration needs. Network 124 may include a configuration capable of transmission control protocol/Internet protocol (TCP/IP) communications for the transmission or reception of packets in a network. Electronic device 102 may also operate in conjunction with a user datagram protocol/IP (UDP/IP) or any other suitable protocol where appropriate and based on particular needs.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function.

One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency (RF) signals from internal radios and external smartphones in proximity to personal computers have interfered with the SoCs and caused basic functionality issues, including display flickering and system hang/reboot. Some SoC designs introduce disaggregation and multichip package (MCP) using EMIB which can increase both RF interference and immunity risk. Also, scalable package-level shielding techniques (simultaneously shielding both the package and the dies) are required for some Internet of things (IoT), data centers, SoCs, and seven (7)/ten (10) nm disaggregated products.

In some systems, the package layer-count increases to provide a package surface shielding with a ground layer at the expense of package cost and Z-height. However, this can be insufficient because of multiple-die radiation. In addition, package surface shielding with an additional ground layer reduces RF noise radiation/coupling at the expense of package cost and Z-height increases. In other systems, a conductive coating may be used. However, conductive coating, such as metal sputtering, can be considered to be prohibitively-expensive and is an uncertified manufacturing process for SoC applications and high-volume manufacturing.

In other systems, an on-board shield solution may be used to implement a Faraday cage with a motherboard and PCB ground contacts. While on-board shielding solutions are relatively common, they require good ground stitching between the Faraday cage and motherboard and PCB ground contacts. In general, about 2.5 to about five (5) mm ground stitching space (about $\lambda/20$ to about $\lambda/10$) is required to provide good shielding effectiveness up to about five (5) to about six (6) GHz WiFi channels. This requirement is almost impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on MB PCB designs and technologies (e.g., Type-3 PCB vs. Type-4 PCB). The on-board shielding solutions are applicable only for Type-4 PCBs, which are higher cost than Type-3 PCBs and are used only for a small number of premium PCs. High volume manufactured PCs are designed with Type-3 PCBs.

In addition, the increase in performance and/or function causes an increase in the thermal challenges of the devices and systems. For example, in some devices, it can be difficult to cool one or more heat sources, especially when the heat sources are relatively close together and/or are located inside a relatively crowded housing that includes memory, processors, battery, etc. The relatively crowded housing can also make it difficult to locate thermal solutions inside the crowded housing and dissipate heat from the heat source. One solution is to transfer the heat from the crowded area to an area that is not crowded using a heat pipe. However, current heatsinks and heat pipes are typically made with metal or some other thermally and electrically conductive material and have been identified as a major cause of RF noise radiation in some systems.

For example, a heat pipe on top of a power delivery integrated circuit can be the noise source to the broadband RF noise in Wi-Fi 5-GHz band. In some systems, the RF noise originating from the integrated circuit is coupled to the heatsink and radiates throughout the electronic device. This effect becomes exacerbated in recent miniaturized and compact systems where the Wi-Fi antennas are located close to the heat pipe. For example, in some systems, the antenna are less than 10 mm away from the heat pipe. In such systems, the heat pipe can be a significant RF aggressor and ultimately degrade wireless communication performance.

In addition to antenna interference problems, the heat pipe is susceptible to RF noise from the environment and can inject those noise elements to the components around it, forcing those components to be subject to RF noise issues. In some systems, it can be common for an integrated circuit and an SoC to share a heat pipe. This shared heat pipe subjects the SoC to RF noise from the integrated circuit and vice versa, forcing both devices to have to resolve the noise issues or forcing the system to apply a costly system-level solution to the RFI.

Currently, there are some attempts to reduce the RFI associated with the heat pipe. One solution is to ground the heat pipe, typically with gaskets. However, the grounding does not sufficiently reduce high frequency RFI and often there is not sufficient space to locate the grounding gaskets. In addition, grounding can be inconsistent due to an inconsistent or poor electrical contact of grounding gaskets. In some systems, use of a gasket for grounding can restrict air flow and reduce the ability of the system to cool one or more heat sources. Another current solution is to apply an EMI absorber. However, an EMI absorber has additional manufacturing cost and, in some systems, can reduce the heat transfer away from components and reduce the ability of the system to cool one or more heat sources. Yet another current solution is to use an antenna keep-out-zone and design the system so the antenna is located away from RFs. However, the antenna location is relevant to product design and in some systems, the keep out distance is limited due to small form factor design. What is needed is a system to enable a heat pipe to help reduce and mitigate the effects of radio frequency interference.

A system to enable a heat pipe to help reduce radio frequency interference, as outlined in FIG. 1, can resolve these issues (and others). In an example, metal blocks or bumps that can distribute electrical capacitive contacts along the heat pipe may be used to create a physical RF filter integrated into the heat pipe and help mitigate and reduce RFI that travels along the heat pipe. More specifically, the heat pipe can include RFI bumps that have a height, a width, and a spacing between the PCB and each other that may be used to help reduce and mitigate the effects of RFI. Using the RFI bumps, the spacing between the RFI bump and the PCB will determine the capacitive properties of the RFI bumps. The height and the width of the RFI bumps will determine the inductance of the RFI bumps. By constructing the conductance (L) and the capacitance (C) from the physical layout or geometry of the RFI bumps (the dimensions of the FRI bumps), an LC filter can be created. The LC filter can be tuned to reduce the RF noise along the heat pipe such that the amplification of the noise by the heat pipe is mitigated.

Electronic device 102 can include a heat pipe configured as a physical RF filter. More specifically, RFI mitigating heat pipe 108 can be configured to implement electromagnetic waves filters operating in RF bands by adding electrically conductive RFI bumps on to the heat pipe. These RFI bumps can be configured with a particular dimension along the heat pipe to create an RF filter and provide a resonant frequency in specific RF bands and help reduce and mitigate the effects of RFI.

There are multiple ways to configure the RFI bumps, depending on the noise or RFI to be mitigated and design constraints. One way to configure the RFI bumps is that the conductance and the capacitance are created from the design parameters of the width, length, and spacing between the PCB and/or chassis. Each RFI bump can have the same dimension to create an RF equivalent RF filter in a single band. Another way to configure the RFI bumps is to create a multi-band system where different groups of RFI bumps have a different dimensions or geometry. There can also be a single row of RFI bumps or a multi constructive array where multiple RFI bumps are side by side. This allows the system to be flexible in covering multiple RF bands by deploying different RFI bump topologies. These topologies could be varied within a single row of RFI bumps or could be extended to double rows, triple rows, etc. and each row could have different spacing optimized to different frequency filter objectives. The distance between each of the RFI bumps depends on design constraints and the amount of noise reduction that is desired. The RFI bumps can be comprised of copper, aluminum, silver, gold, graphite, conductive polymers, steel, stainless steel, or any other electrical conductor that allows the RFI bumps to act as an LC filter. The RFI bumps are secured to the heat pipe with a conductive material and can be attached to the heat pipe during construction of the heat pipe (e.g., sputtering) or added with tape or solder after construction of the heat pipe.

In some current approaches where the heat pipe is grounded, the PCB ground plane needs to be opened and a physical connection needs to be made from the heat pipe to the PCB ground plane. RFI mitigating heat pipe 108 can be configured to use a capacitive contact and does not need a physical contact to the PCB ground plane. As a result, instead of physical electrical contact to the ground plane, or ground surface, RFI mitigating heat pipe 108 can use a non-electrical contact approach (an inductive and capacitive approach) that can emulate the electrical contact (electrical ground contact) without having a physical contact.

The operating frequency of RFI mitigating heat pipe 108 can be tuned and optimized by modifying the physical structure and dimensions of the RFI bumps of RFI mitigating heat pipe 108. Also, RFI mitigating heat pipe 108 can be configured to provide broadband and multiple bands effectiveness. In addition, RFI mitigating heat pipe 108 can be implemented in platforms with different form factors and designers can modify the dimension of the RFI bumps so as to make the design of RFI mitigating heat pipe 108 fit into the system and cover interested RF bands at same time. In addition, RFI mitigating heat pipe 108 can provide for a relatively low-cost system to mitigate the effects of RFI as compared to an EMI absorber.

In an example, a heat source (e.g., an integrated circuit) under a heatsink is identified as a main RF noise source. RFI bumps can be secured to the heat pipe and the dimension of the RFI bumps, including width (w), length (l), height (h) and gaps between each bump (g) and PCB (s) is designed in accordance with the interested RF bands to create an RF filter. More specifically, a heat pipe without RFI bumps can be considered as an original unmodified heat pipe and may be regarded as a transmission line with an equivalent inductance LT and capacitance CT. RFI bumps can be coupled to the heat pipe to introduce an in-series LC circuit. By tuning the dimension and the number of the RFI bumps, the total impedance of the heat pipe can be tuned to resonate at interested RF bands and help mitigate the effect of the RFI. The center of operating frequency fc is written as:

$$fc = \frac{1}{2\pi\sqrt{LmCm}}$$

$$Lm = Lt + (Lb1\|Lb2 \ldots \|Lbn)$$

$$Cm = Ct + (Cb1\|Cb2 \ldots \|Cbn)$$

Turning to the infrastructure of FIG. 1, network 124 represents a series of points or nodes of interconnected communication paths for receiving and transmitting packets of information. Network 124 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 124, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic device 102 is meant to encompass a computer, a personal digital assistant (PDA), a laptop or electronic notebook, a cellular telephone, an iPhone, an IP phone, network elements, network appliances, servers, routers, switches, gateways, bridges, load balancers, processors, modules, or any other device, component, element, or object that includes a radiation source and/or a radiation sensitive device. Electronic device 102 may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102*a*-120*d* may include virtual elements.

In regards to the internal structure, electronic device 102 can include memory elements for storing information to be used in operations. Electronic device 102 may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, electronic device 102 can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Figure 2A:
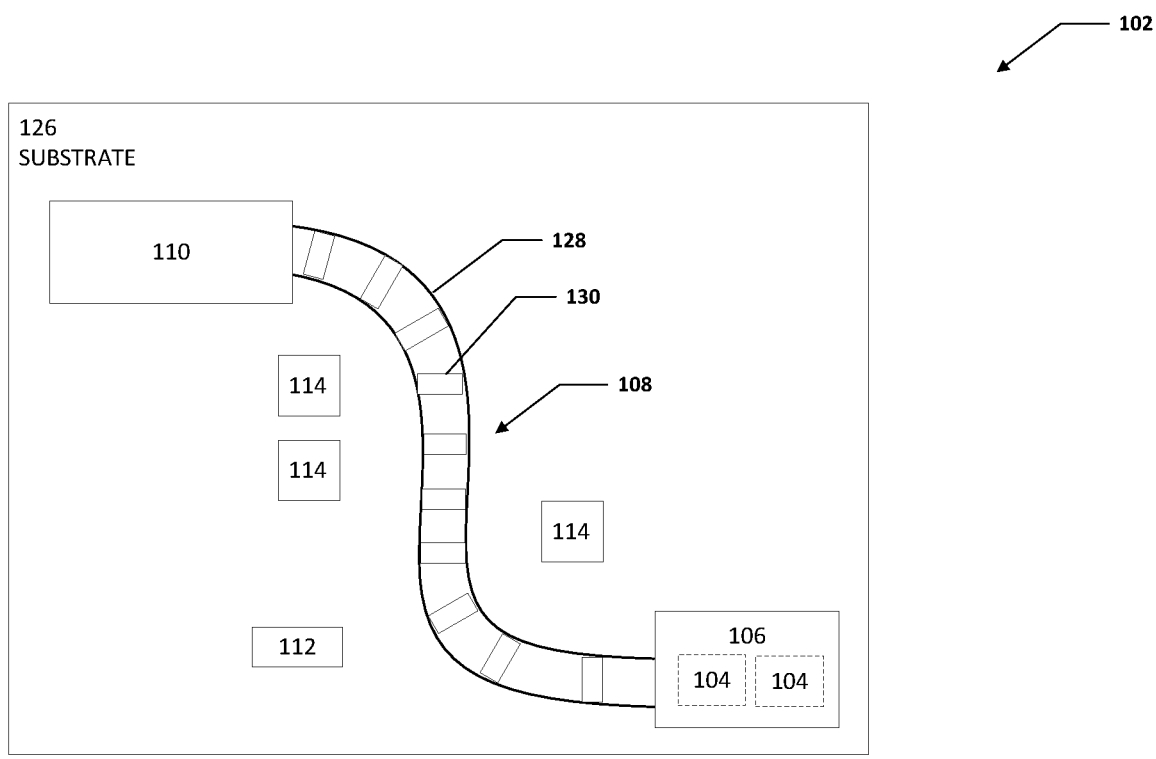
FIG. 2A is a simplified block diagram of a partial view of a system to enable a heat pipe to help reduce radio frequency interference, in accordance with an embodiment of the present disclosure.

Turning to FIG. 2A, FIG. 2A is a simplified block diagram of a portion of electronic device 102. Electronic device 102 can include one or more heat sources 104, thermal conductor 106, RFI mitigating heat pipe 108, heatsink 110, radiation sensitive component 112, and one or more electronic components 114. One or more of one or more heat sources 104, thermal conductor 106, RFI mitigating heat pipe 108, heatsink 110, radiation sensitive component 112, and one or more electronic components 114 can be on a substrate 126. RFI mitigating heat pipe 108 can include a heat pipe 128 and a plurality of RFI bumps 130.

Figure 2B:
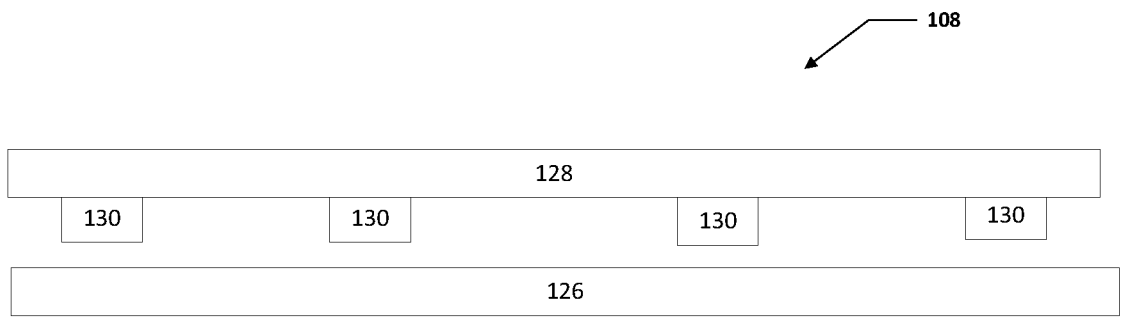
FIG. 2B is a simplified block diagram of a portion of a partial view of a system to enable a heat pipe to help reduce radio frequency interference, in accordance with an embodiment of the present disclosure.

Turning to FIG. 2B, FIG. 2B is a simplified block diagram of a side view of a portion of RFI mitigating heat pipe 108. RFI mitigating heat pipe 108 can include heat pipe 128 and plurality of RFI bumps 130. In an example, each of plurality of RFI bumps 130 extend from heat pipe 128 towards substrate 126 but do not come into contact with substrate 126.

Figure 3A:
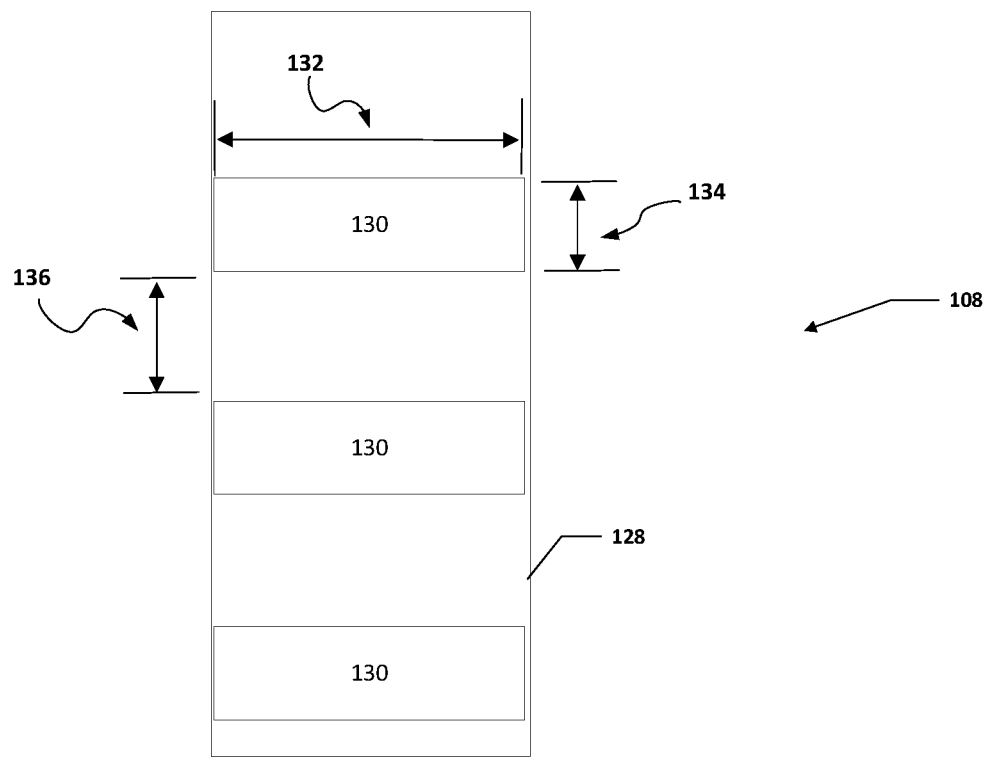
FIG. 3A is a simplified block diagram of a portion of a system to enable a heat pipe to help reduce radio frequency interference, in accordance with an embodiment of the present disclosure.

Turning to FIG. 3A, FIG. 3A is a simplified block diagram of a portion of RFI mitigating heat pipe 108. RFI mitigating heat pipe 108 can include heat pipe 128 and plurality of RFI bumps 130. Each of plurality of RFI bumps 130 can have an RFI bump width 132 and an RFI bump length 134. RFI bump spacing 136 can be the distance between each RFI bump 130.

Figure 3B:
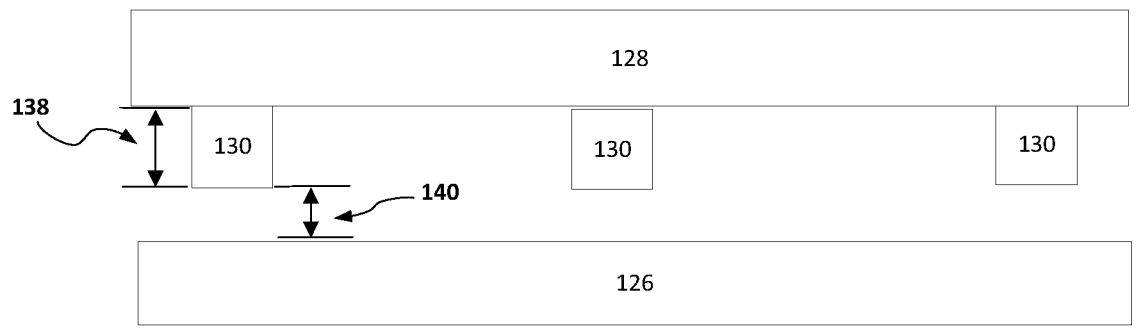
FIG. 3B is a simplified block diagram of a portion of a system to enable a heat pipe to help reduce radio frequency interference, in accordance with an embodiment of the present disclosure.

Turning to FIG. 3B, FIG. 3B is a simplified block diagram of a portion of RFI mitigating heat pipe 108. RFI mitigating heat pipe 108 can include heat pipe 128 and plurality of RFI bumps 130. Each of plurality of RFI bumps 130 can extend from heat pipe 128 an RFI bump height 138 towards substrate 126. RFI bump substrate gap 140 can be the distance between RFI bump 130 and substrate 126.

Figure 3C:
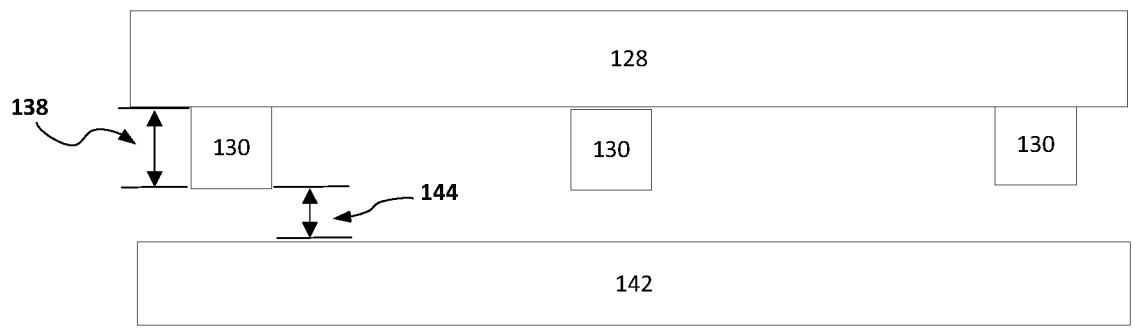
FIG. 3C is a simplified block diagram of a portion of a system to enable a heat pipe to help reduce radio frequency interference, in accordance with an embodiment of the present disclosure.

Turning to FIG. 3C, FIG. 3C is a simplified block diagram of a portion of RFI mitigating heat pipe 108. RFI mitigating heat pipe 108 can include heat pipe 128 and plurality of RFI bumps 130. In some examples, RFI mitigating heat pipe 108 can extend over a chassis 142 of electronic device 102 instead of a substrate (e.g., substrate 126 illustrated in FIG. 3B). Each of plurality of RFI bumps 130 can extend from heat pipe 128 an RFI bump height 138 towards substrate 126. RFI bump chassis gap 144 can be the distance between RFI bump 130 and chassis 142.

Figure 3D:
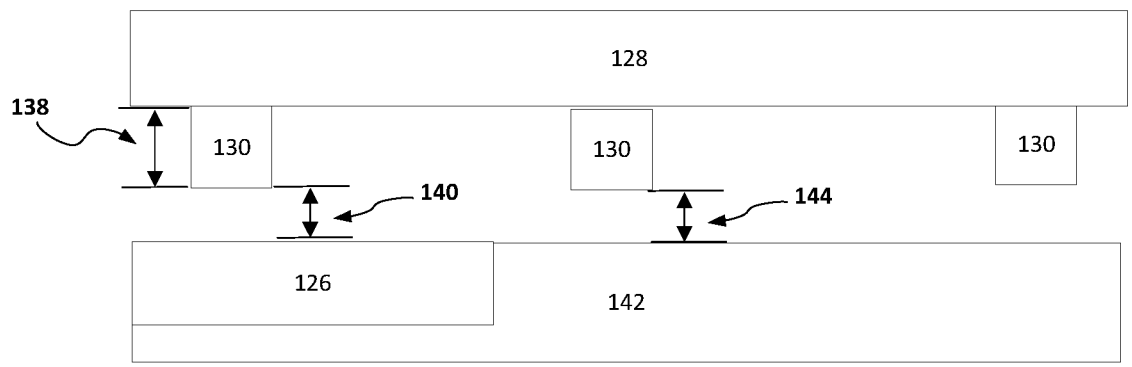
FIG. 3D is a simplified block diagram of a portion of a system to enable a heat pipe to help reduce radio frequency interference, in accordance with an embodiment of the present disclosure.

Turning to FIG. 3D, FIG. 3D is a simplified block diagram of a portion of RFI mitigating heat pipe 108. RFI mitigating heat pipe 108 can include heat pipe 128 and plurality of RFI bumps 130. In some examples, a first portion of RFI mitigating heat pipe 108 can extend over substrate 126 and a second portion of RFI mitigating heat pipe 108 can extend over chassis 142 of electronic device 102. A first portion of plurality of RFI bumps 130 can extend from heat pipe 128 an RFI bump height 138 towards substrate 126. A second portion of RFI bumps 130 can extend from heat pipe 128 an RFI bump height 138 towards chassis 142. RFI bump substrate gap 140 can be the distance between RFI bump 130 and substrate 126. RFI bump chassis gap 144 can be the distance between RFI bump 130 and chassis 142. In some examples, RFI bump substrate gap 140 and RFI bump chassis gap 144 are the same or a similar distance to allow RFI mitigating heat pipe 108 to be tuned to a resonant frequency in a specific RF band and help mitigate the effects of RFI.

Figure 3E:
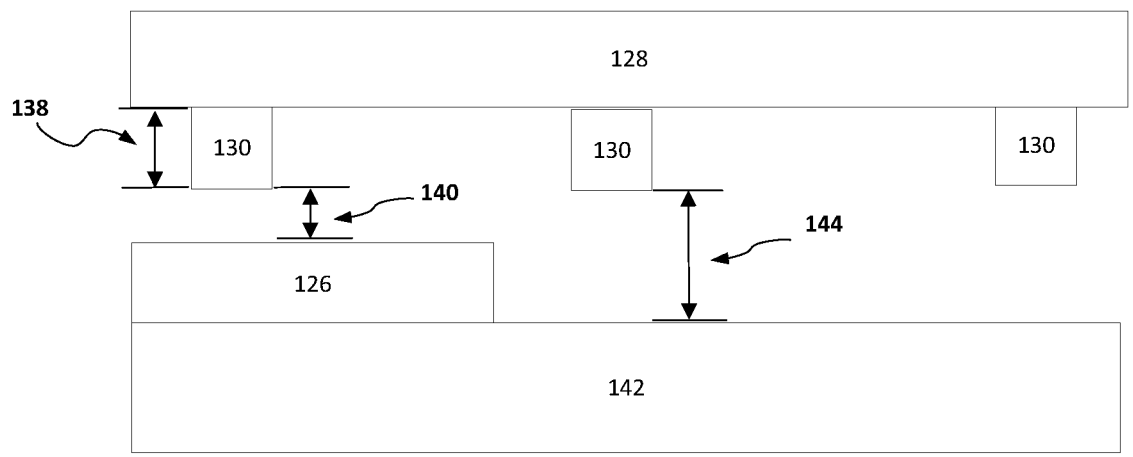
FIG. 3E is a simplified block diagram of a portion of a system to enable a heat pipe to help reduce radio frequency interference, in accordance with an embodiment of the present disclosure.

Turning to FIG. 3E, FIG. 3E is a simplified block diagram of a portion of RFI mitigating heat pipe 108. RFI mitigating heat pipe 108 can include heat pipe 128 and plurality of RFI bumps 130. In some examples, a first portion of RFI mitigating heat pipe 108 can extend over substrate 126 and a second portion of RFI mitigating heat pipe 108 can extend over chassis 142 of electronic device 102. A first portion of plurality of RFI bumps 130 can extend from heat pipe 128 an RFI bump height 138 towards substrate 126. A second portion of RFI bumps 130 can extend from heat pipe 128 an RFI bump height 138 towards chassis 142. RFI bump substrate gap 140 can be the distance between RFI bump 130 and substrate 126. RFI bump chassis gap 144 can be the distance between RFI bump 130 and chassis 142. In some examples, RFI bump substrate gap 140 is different than RFI bump chassis gap 144. The distance of RFI bump substrate gap 140 allows the portion of RFI mitigating heat pipe 108 over substrate 126 to be tuned to a resonant frequency in a specific RF band and the distance of RFI bump chassis gap 144 allows the portion of RFI mitigating heat pipe 108 over chassis 142 to be tuned to a different resonant frequency in a different specific RF band and help mitigate the effects of RFI.

Figure 4:
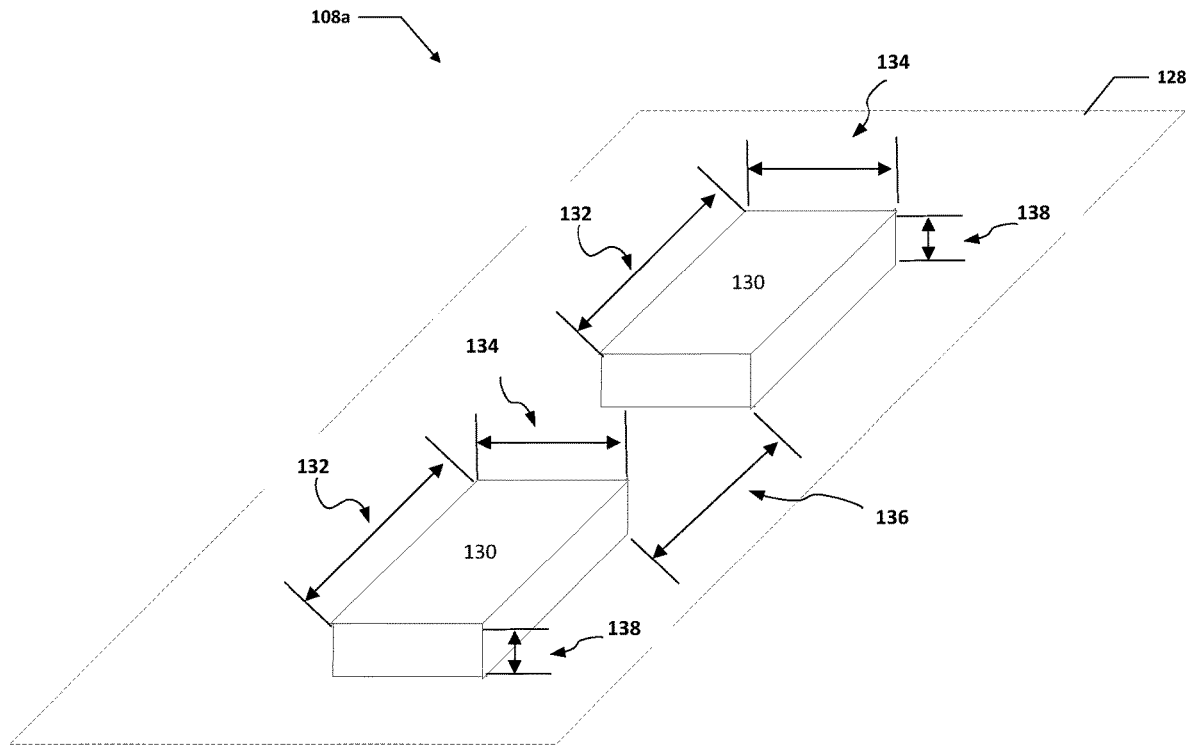
FIG. 4 is a simplified block diagram of a portion of a system to enable a heat pipe to help reduce radio frequency interference, in accordance with an embodiment of the present disclosure.

Turning to FIG. 4, FIG. 4 is a simplified block diagram of a portion of RFI mitigating heat pipe 108a. RFI mitigating heat pipe 108a can include heat pipe 128 and plurality of RFI bumps 130. As illustrated in FIG. 4, each RFI bump 130 can have the same or similar dimensions. More specifically, each RFI bump can have the same RFI bump width 132, RFI bump length 134, and RFI bump height 138 to allow for a single band RF filter that provides a resonant frequency in a specific RF band and help mitigate the effects of RFI. In addition, RFI bump spacing 136 can be the same between each RFI bump 130 to help allow for a single band RF filter that provides the resonant frequency in the specific RF band and help mitigate the effects of RFI.

Figure 5:
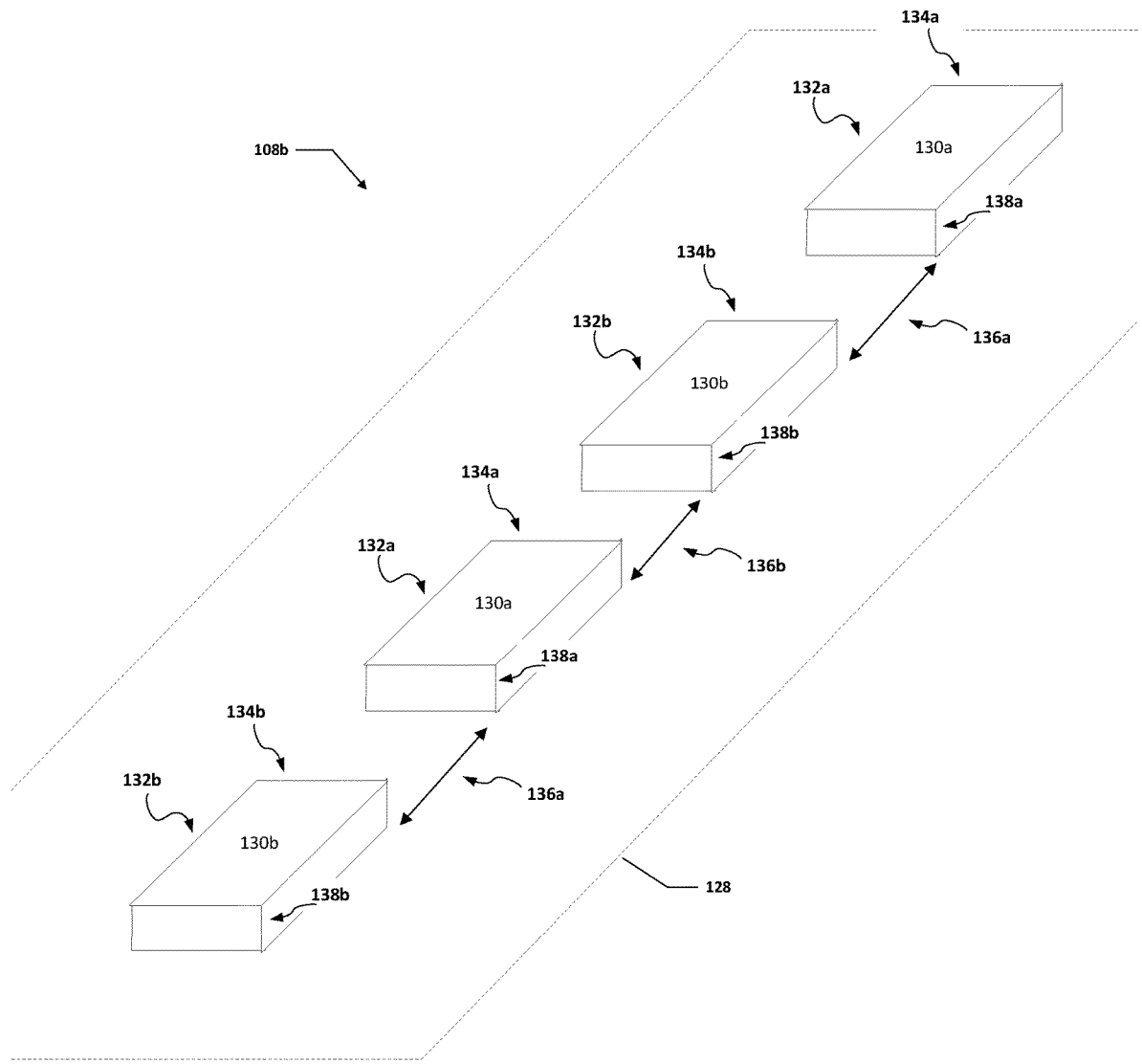
FIG. 5 is a simplified block diagram of a portion of a system to enable a heat pipe to help reduce radio frequency interference, in accordance with an embodiment of the present disclosure.

Turning to FIG. 5, FIG. 5 is a simplified block diagram of a portion of RFI mitigating heat pipe 108b. RFI mitigating heat pipe 108b can include heat pipe 128 and plurality of RFI bumps 130a and 130b. As illustrated in FIG. 5, RFI bumps 130a can have the same or similar dimensions and RFI bumps 130b can have the same or similar dimensions. More specifically, each of RFI bumps 130a can have the same RFI bump width 132a, RFI bump length 134a, and RFI bump height 138a. Also, each of RFI bumps 130b can have the same RFI bump width 132b, RFI bump length 134b, and RFI bump height 138b. In addition, RFI bumps 130a can have one or more different dimensions than RFI bump 130b. More specifically, RFI bump width 132a can be different than RFI bump width 132b, RFI bump length 134a can be different than RFI bump length 134b, and/or RFI bump height 138a can be different than RFI bump height 138b to allow for a dual band RF filter that provides resonant frequencies in specific RF bands and help mitigate the effects of RFI. In addition, RFI bump spacing 136a and 136b can be different between each RFI bump 130a and 130b to help to allow for a dual band RF filter that provides resonant frequencies in specific RF bands and help mitigate the effects of RFI.

Figure 6:
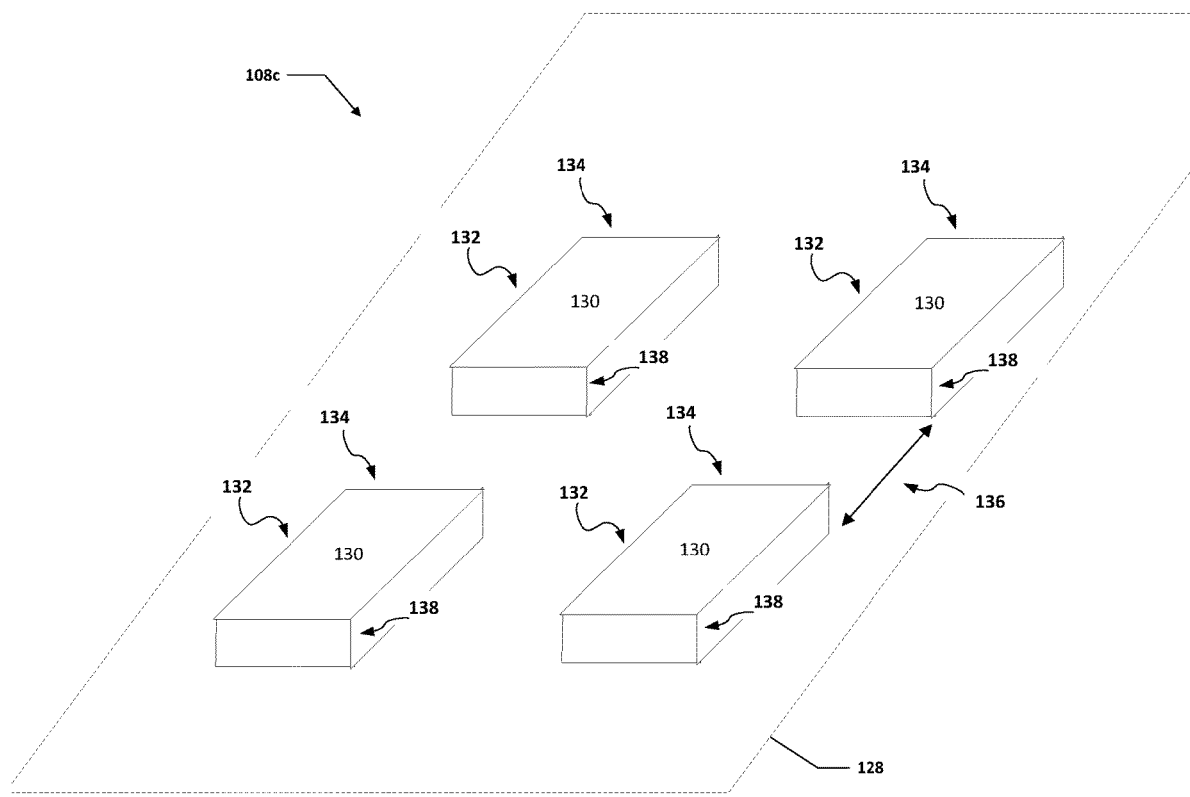
FIG. 6 is a simplified block diagram of a portion of a system to enable a heat pipe to help reduce radio frequency interference, in accordance with an embodiment of the present disclosure.

Turning to FIG. 6, FIG. 6 is a simplified block diagram of a portion of RFI mitigating heat pipe 108c. RFI mitigating heat pipe 108c can include heat pipe 128 and plurality of RFI bumps 130. As illustrated in FIG. 6, each RFI bump 130 can have the same or similar dimensions. More specifically, each RFI bump can have the same RFI bump width 132, RFI bump length 134, and RFI bump height 138 to allow for a single band RF filter that provides a resonant frequency in a specific RF band and help mitigate the effects of RFI. In addition, RFI bump spacing 136 can be the same between each RFI bump 130 to help allow for a single band RF filter that provides the resonant frequency in the specific RF band and help mitigate the effects of RFI. Also, as illustrated in FIG. 6, RFI mitigating heat pipe 108c can include two rows of RFI bumps 130 rather the one single row. In some examples, two or more rows of RFI bumps 130 can allow for an increase in the number of RFI filters on RFI mitigating heat pipe 108.

Figure 7:
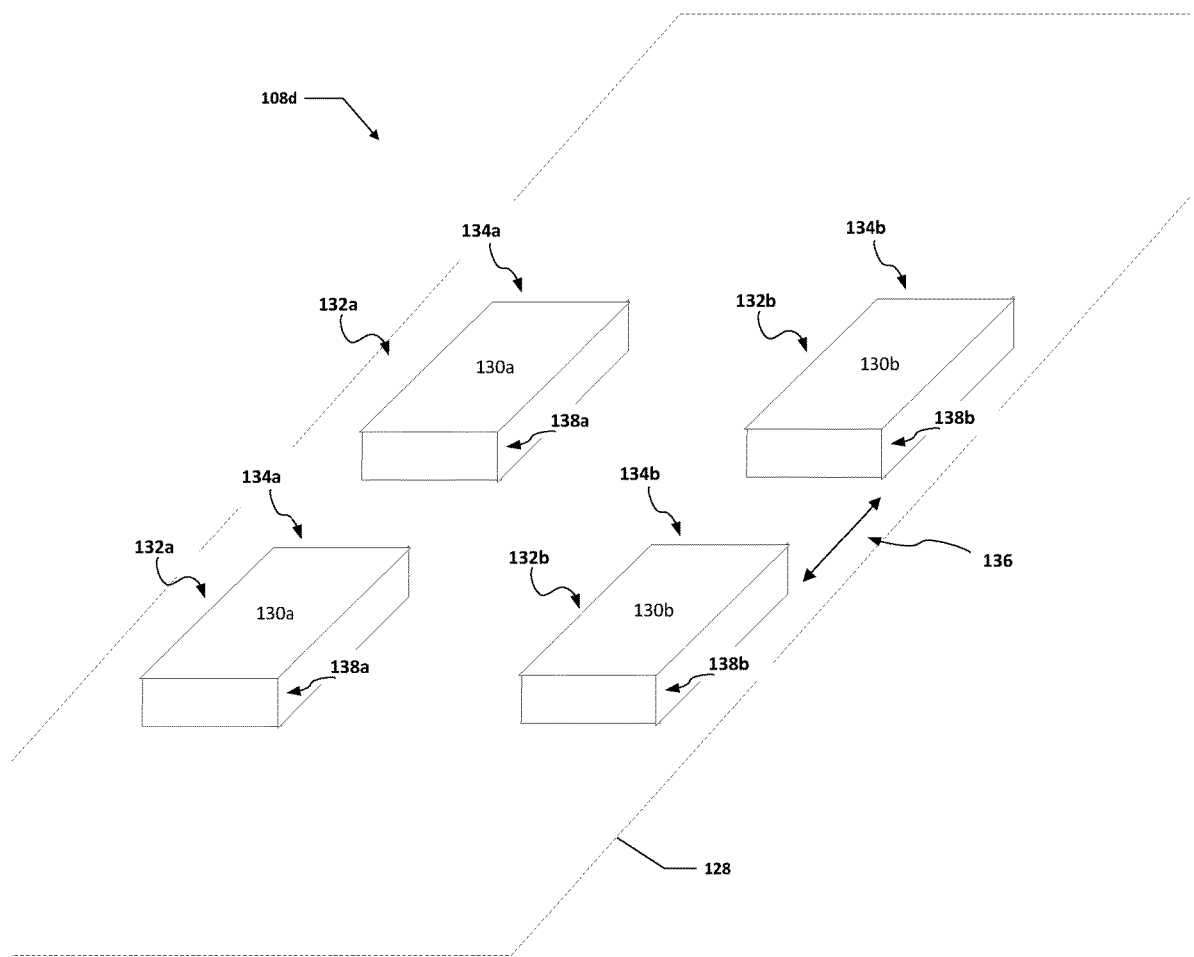
FIG. 7 is a simplified block diagram of a portion of a system to enable a heat pipe to help reduce radio frequency interference, in accordance with an embodiment of the present disclosure.

Turning to FIG. 7, FIG. 7 is a simplified block diagram of a portion of RFI mitigating heat pipe 108d. RFI mitigating heat pipe 108d can include heat pipe 128 and plurality of RFI bumps 130a and 130b. As illustrated in FIG. 7, RFI bumps 130a can be in a first row and each have the same or similar dimensions and RFI bumps 130b can be in a second row and each have the same or similar dimensions. More specifically, each of RFI bumps 130a can have the same RFI bump width 132a, RFI bump length 134a, and RFI bump height 138a. Also, each of RFI bumps 130b can have the same RFI bump width 132b, RFI bump length 134b, and RFI bump height 138b. In addition, RFI bumps 130a can have one or more different dimensions than RFI bump 130b. More specifically, RFI bump width 132a can be different than RFI bump width 132b, RFI bump length 134a can be different than RFI bump length 134b, and/or RFI bump height 138a can be different than RFI bump height 138b to allow for a dual band RF filter that provides resonant frequencies in specific RF bands and help mitigate the effects of RFI.

Figure 8:
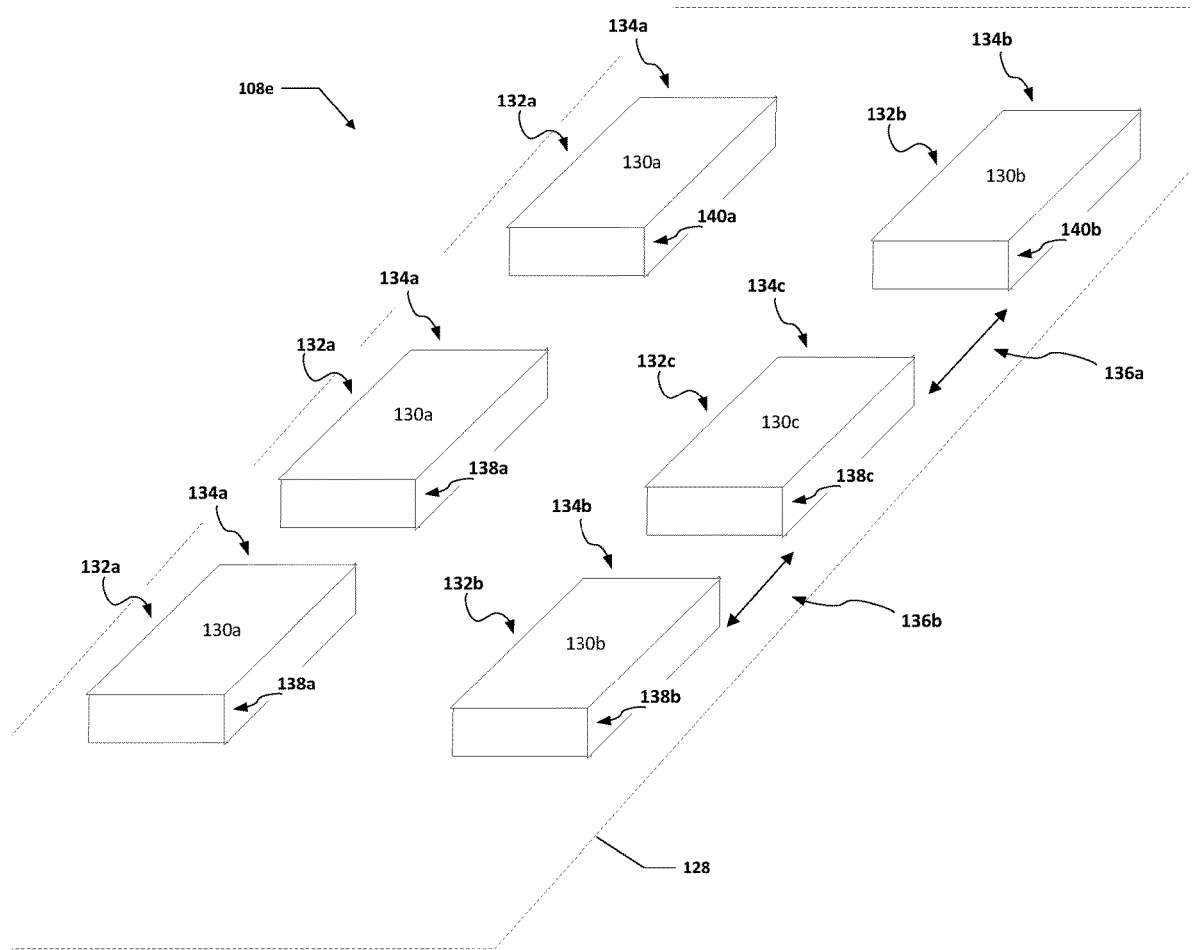
FIG. 8 is a simplified block diagram of a portion of a system to enable a heat pipe to help reduce radio frequency interference, in accordance with an embodiment of the present disclosure.

Turning to FIG. 8, FIG. 8 is a simplified block diagram of a portion of RFI mitigating heat pipe 108b. RFI mitigating heat pipe 108b can include heat pipe 128 and plurality of RFI bumps 130a, 130b, and RFI bumps 130c. As illustrated in FIG. 8, RFI bumps 130a can be in a first row and each can have the same or similar dimensions. More specifically, each of RFI bumps 130a can have the same RFI bump width 132a, RFI bump length 134a, and RFI bump height 138a. RFI bumps 130b can be in a second row and each have the same or similar dimensions and RFI bumps 130c can also be in the second row and each have the same or similar dimensions. More specifically, each of RFI bumps 130b can have the same RFI bump width 132b, RFI bump length 134b, and RFI bump height 138b. Also, each of RFI bumps 130c can have the same RFI bump width 132c, RFI bump length 134c, and RFI bump height 138c. RFI bump widths 132a, 132b, and/or 132c can each be different, RFI bump lengths 134a, 134b, and/or 132c can each be different, and/or RFI bump heights 138a, 138b, and/or 138c can each be different to allow for a multi band RF filter that provides resonant frequencies in specific RF bands and help mitigate the effects of RFI. In addition, RFI bump spacing 136a and 136b can be different between each RFI bump 130b and 130c to help allow for a multi band RF filter that provides resonant frequencies in specific RF bands and help mitigate the effects of RFI.

Figures 9, 10:
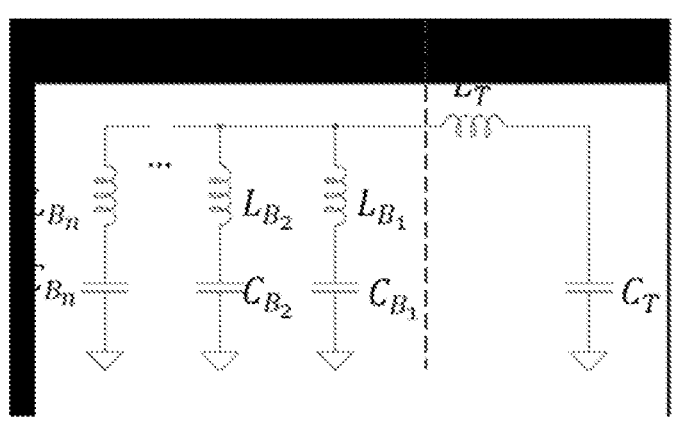
FIG. 9 is a simplified block diagram illustrating example details of a system to enable a heat pipe to help reduce radio frequency interference, in accordance with an embodiment of the present disclosure.
FIG. 10 is a simplified block diagram illustrating example details of a system to enable a heat pipe to help reduce radio frequency interference, in accordance with an embodiment of the present disclosure.

Turning to FIG. 9, FIG. 9 is a simplified table 146 illustrating example details of a system to enable a heat pipe to help reduce radio frequency interference, in accordance with an embodiment of the present disclosure. In an example, RFI bumps 130 can be tuned to resonate at a five (5) GHz band. More specifically, RFI bumps 130 can be configured to have an RFI bump width 132 of about four (4) mm (0.075 λc), an RFI bump length 134 of about eight (8) mm (0.15 λc), RFI bump spacing 136 of about 4.5 mm (0.84 λc), an RFI bump height 138 of about 1.5 mm (0.28 λc), and an RFI bump substrate gap 140 (or RFI bump chassis gap 144) of about 0.5 mm (0.9 λc). These dimensions allow RFI bumps 130 to help mitigate the effects of RFI at the five (5) GHz band.

Turning to FIG. 10, FIG. 10 is a simplified equivalent circuit 148 illustrating example details of a system to enable a heat pipe to help reduce radio frequency interference, in accordance with an embodiment of the present disclosure. As illustrated in FIG. 10, an original heat pipe 128 may be regarded as a transmission line with an equivalent inductance LT and capacitance CT. When RFI bumps 130 are coupled to heat pipe 128, RFI bumps 130 introduce an in-series LC circuit. By tuning the dimension and the number of the RFI bumps, the total impedance of the heat pipe can be tuned to resonate at interested RF bands. The center of operating frequency fc is written as:

$$fc = \frac{1}{2\pi\sqrt{LmCm}}$$

$$Lm = Lt + (Lb1||Lb2 \ldots ||Lbn)$$

$$Cm = Ct + (Cb1||Cb2 \ldots ||Cbn)$$

Figure 11:
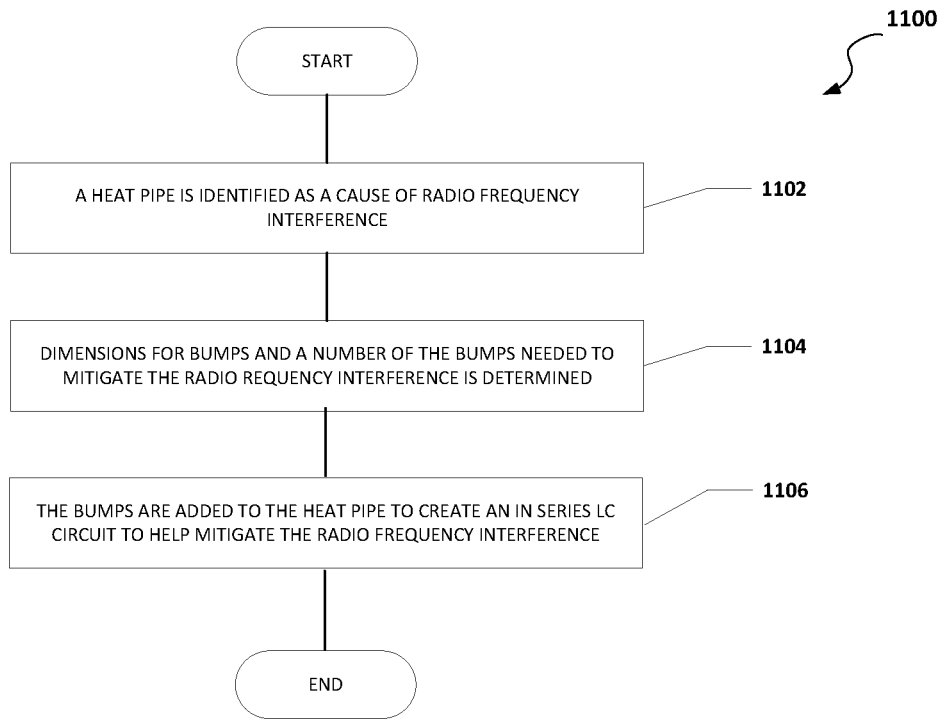
FIG. 11 is a simplified flowchart illustrating potential operations that may be associated with the system in accordance with an embodiment.

Turning to FIG. 11, FIG. 1 is an example flowchart illustrating possible operations of a flow 1100 that may be associated with enabling a heat pipe to help reduce radio frequency interference, in accordance with an embodiment. At 1102, a heat pipe is identified as a cause of RFI. At 1104, dimensions for bumps and a number of the bumps needed to mitigate the RFI is determine. At 1106, the bumps are added to the heat pipe to create an in-series LC circuit to help mitigate the RFI.

It is also important to note that the operations described above and in the preceding flow diagram (i.e., FIG. 11) illustrates only some of the possible correlating scenarios that may be executed by, or within, electronic device 102. Some of these operations may be deleted or removed where appropriate, or these operations may be modified or changed considerably without departing from the scope of the present disclosure. In addition, the timing of these operations may be altered considerably. The preceding operational flows have been offered for purposes of example and discussion. Substantial flexibility is provided by electronic device 102 in that any suitable arrangements, chronologies, configurations, and mechanisms may be provided without departing from the teachings of the present disclosure.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic device 102 has been illustrated with reference to particular elements and operations, these elements and operations may be replaced by any suitable architecture, protocols, and/or processes that achieve the intended functionality of electronic device 102.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

Other Notes and Examples

In Example A1, an electronic device includes a substrate and a heat pipe. The heat pipe includes a plurality of bumps that extend from the heat pipe towards the substrate but do not come into contact with the substrate.

In Example A2, the subject matter of Example A1 can optionally include where the bumps help to mitigate radio frequency interference in the electronic device.

In Example A3, the subject matter of any one of Examples A1-A2 can optionally include where the bumps are configured to provide a resonant frequency in a specific radio frequency band and act as a radio frequency filter.

In Example A4, the subject matter of any one of Examples A1-A3 can optionally include where the bumps are tuned to reduce radio frequency interference that travels along the heat pipe.

In Example A5, the subject matter of any one of Examples A1-A4 can optionally include where a first portion of the plurality of bumps has different dimensions than a second portion of the plurality of bumps.

In Example A6, the subject matter of any one of Examples A1-A5 can optionally include where the bumps are in two or more rows along the heat pipe.

In Example A7, the subject matter of any one of Examples A1-A6 can optionally include where the plurality of bumps extend from the heat pipe towards a chassis of the electronic device but do not come into contact with the chassis.

In Example AA1 an electronic device includes a chassis, a substrate, an antenna, where the antenna is sensitive to radio frequency interference, a heat source on the substrate, where the heat source produces radio frequency interference, and a heat pipe coupled to the heat source, where the heat pipe includes a plurality of bumps that extend from the heat pipe towards the chassis but do not come into contact with the chassis.

In Example AA2, the subject matter of Example AA1 can optionally include where the bumps help to mitigate the radio frequency interference from the heat source.

In Example AA3, the subject matter of any one of the Examples AA1-AA2 can optionally include where the bumps are configured as an LC filter.

In Example AA4, the subject matter of any one of the Examples AA1-AA3 can optionally include where the bumps are tuned to reduce radio frequency interference that travels along the heat pipe.

In Example AA5, the subject matter of any one of the Examples AA1-AA4 can optionally include where a first portion of the plurality of bumps has different dimensions than a second portion of the plurality of bumps.

In Example AA6, the subject matter of any one of the Examples AA1-AA5 can optionally include where the bumps are in a single row.

In Example AA7, the subject matter of any one of the Examples AA1-AA6 can optionally include where the plurality of bumps extend from the heat pipe towards the substrate but do not come into contact with the substrate.

Example M1 is a method including determining that a heat pipe is a cause of radio frequency interference, determining a configuration of bumps along the heat pipe that will mitigate the radio frequency interference, and creating a heat pipe with radio frequency interference reducing bumps to reduce the radio frequency interference from the heat pipe.

In Example M2, the subject matter of Example M1 can optionally include where the heat pipe is coupled to a heat source that is the at least partially a source of the radio frequency interference.

In Example M3, the subject matter of any one of the Examples M1-M2 can optionally include where the bumps are configured as an LC filter.

In Example M4, the subject matter of any one of the Examples M1-M3 can optionally include where determining a first configuration of bumps along the heat pipe that will provide a first resonant frequency in a first radio frequency band and act as a first radio frequency filter, determining a second configuration of bumps along the heat pipe that will provide a second resonant frequency in a second radio frequency band and act as a second radio frequency filter, and creating a heat pipe that includes the first configuration of bumps and the second configuration of bumps.

In Example M5, the subject matter of any one of the Examples M1-M3 can optionally include where determining a first configuration of bumps along the heat pipe that will provide a first resonant frequency in a first radio frequency band and act as a first radio frequency filter, determining a second configuration of bumps along the heat pipe that will provide a second resonant frequency in a second radio frequency band and act as a second radio frequency filter, where the created heat pipe includes the first configuration of bumps and the second configuration of bumps.

In Example M6, the subject matter of any one of the Examples M1-M5 can optionally include where a first portion of the bumps has different dimensions than a second portion of the bumps.

In Example M7, the subject matter of any one of the Examples M1-M6 can optionally include where the bumps are in two or more rows and each row of the bumps has a different dimension than the other row or rows of bumps.

Example AAA1 is an apparatus including means for determining that a heat pipe is a cause of radio frequency interference, means for determining a configuration of bumps along the heat pipe that will mitigate the radio frequency interference, and means for creating a heat pipe with radio frequency interference reducing bumps to reduce the radio frequency interference from the heat pipe.

In Example AAA2, the subject matter of Example AAA1 can optionally include where the heat pipe is coupled to a heat source that is the at least partially a source of the radio frequency interference.

In Example AAA3, the subject matter of any one of Examples AAA1-AAA2 can optionally include where the bumps are configured as an LC filter.

In Example AAA4, the subject matter of any one of Examples AAA1-AAA3 can optionally include means for determining a first configuration of bumps along the heat pipe that will provide a first resonant frequency in a first radio frequency band and act as a first radio frequency filter, means for determining a second configuration of bumps along the heat pipe that will provide a second resonant frequency in a second radio frequency band and act as a second radio frequency filter, and means for creating a heat pipe that includes the first configuration of bumps and the second configuration of bumps.

In Example AAA5, the subject matter of any one of Examples AAA1-AAA3 can optionally include means for determining a first configuration of bumps along the heat pipe that will provide a first resonant frequency in a first radio frequency band and act as a first radio frequency filter, means for determining a second configuration of bumps along the heat pipe that will provide a second resonant frequency in a second radio frequency band and act as a second radio frequency filter, where the created heat pipe includes the first configuration of bumps and the second configuration of bumps In Example AAA6, the subject matter of any one of Examples AAA1-AAA5 can optionally include where a first portion of the bumps has different dimensions than a second portion of the bumps.

In Example AAA7, the subject matter of any one of Examples AAA1-AAA6 can optionally include where the bumps are in two or more rows and each row of the bumps has a different dimension than the other row or rows of bumps.

What is claimed is:

1. An electronic device comprising:
    a substrate; and
    a heat pipe wherein the heat pipe includes a plurality of bumps that extend from the heat pipe towards the substrate but do not come into contact with the substrate, wherein a first subset of the plurality of bumps has a bump to substrate gap and a second subset of the plurality of bumps has a bump to chassis gap and the bump to substrate gap is different than the bump to chassis gap.

2. The electronic device of claim 1, wherein the plurality of bumps help to mitigate radio frequency interference in the electronic device.

3. The electronic device of claim 1, wherein the plurality of bumps are configured to provide a resonant frequency in a specific radio frequency band and act as a radio frequency filter.

4. The electronic device of claim 1, wherein the plurality of bumps are tuned to reduce radio frequency interference that travels along the heat pipe.

5. The electronic device of claim 1, wherein the plurality of bumps extend from the heat pipe towards a chassis of the electronic device but do not come into contact with the chassis.

6. The electronic device of claim 1, wherein the plurality of bumps are in two or more rows along the heat pipe.

7. An electronic device comprising:
    a chassis;
    a substrate;
    an antenna, wherein the antenna is sensitive to radio frequency interference;
    a heat source on the substrate, wherein the heat source produces radio frequency interference; and
    a heat pipe coupled to the heat source, wherein the heat pipe includes a plurality of bumps that extend from the heat pipe towards the chassis but do not come into contact with the chassis, wherein a first portion of the plurality of bumps has a bump to substrate gap and a second portion of the plurality of bumps has a bump to chassis gap and the bump to substrate gap is the same as the bump to chassis gap.

8. The electronic device of claim 7, wherein the plurality of bumps extend from the heat pipe towards the substrate but do not come into contact with the substrate.

9. The electronic device of claim 7, wherein the plurality of bumps help to mitigate the radio frequency interference from the heat source.

10. The electronic device of claim 7, wherein the plurality of bumps are configured as an LC filter.

11. The electronic device of claim 7, wherein the plurality of bumps are tuned to reduce radio frequency interference that travels along the heat pipe.

12. The electronic device of claim 7, wherein the first portion of the plurality of bumps has different dimensions than the second portion of the plurality of bumps.

13. The electronic device of claim 7, wherein the plurality of bumps are in a single row.

14. A method comprising:
    determining that a heat pipe is a cause of radio frequency interference;
    determining a configuration of bumps along the heat pipe that will mitigate the radio frequency interference; and
    creating the heat pipe with a plurality of radio frequency interference reducing bumps to reduce the radio frequency interference from the heat pipe, wherein a first portion of the heat pipe includes a first portion of the plurality of radio frequency interference reducing bumps with a bump to substrate gap and a second portion of the heat pipe includes a second portion of the plurality of radio frequency interference reducing bumps with a bump to chassis gap and the bump to substrate gap is different than the bump to chassis gap.

15. The method of claim 14, wherein the plurality of bumps are in two or more rows and each row of the plurality of bumps has a different dimension than the other row or rows of the plurality of bumps.

16. The method of claim 14, wherein the heat pipe is coupled to a heat source that is at least partially a source of the radio frequency interference.

17. The method of claim 14, wherein the plurality of bumps are configured as an LC filter.

18. The method of claim 14, further comprising:
    determining a first configuration of bumps along the heat pipe that will provide a first resonant frequency in a first radio frequency band and act as a first radio frequency filter; and
    determining a second configuration of bumps along the heat pipe that will provide a second resonant frequency in a second radio frequency band and act as a second radio frequency filter, wherein the created heat pipe includes the first configuration of bumps and the second configuration of bumps.

* * * * *